(12) United States Patent
Oh

(10) Patent No.: US 11,090,546 B2
(45) Date of Patent: Aug. 17, 2021

(54) NON-CONTACT MEASUREMENT DEVICE FOR GOLF COURSE GREEN

(71) Applicant: Jin Woo Oh, Incheon (KR)

(72) Inventor: Jin Woo Oh, Incheon (KR)

( * ) Notice: Subject to any disclaimer, the term of this patent is extended or adjusted under 35 U.S.C. 154(b) by 0 days.

(21) Appl. No.: 16/310,063

(22) PCT Filed: Jun. 9, 2017

(86) PCT No.: PCT/KR2017/006003
§ 371 (c)(1),
(2) Date: Dec. 14, 2018

(87) PCT Pub. No.: WO2017/217698
PCT Pub. Date: Dec. 21, 2017

(65) Prior Publication Data
US 2019/0255417 A1    Aug. 22, 2019

(30) Foreign Application Priority Data
Jun. 16, 2016  (KR) .................. 10-2016-0075113

(51) Int. Cl.
| | |
|---|---|
| *A63B 71/06* | (2006.01) |
| *G01B 11/14* | (2006.01) |
| *G01C 9/06* | (2006.01) |
| *A63B 69/36* | (2006.01) |
| *G01D 21/02* | (2006.01) |

(Continued)

(52) U.S. Cl.
CPC .......... *A63B 71/0622* (2013.01); *A63B 69/36* (2013.01); *A63B 71/06* (2013.01); *G01B 11/14* (2013.01); *G01C 9/06* (2013.01); *G01D 21/02* (2013.01); *H01S 5/026* (2013.01); *A63B 2071/0694* (2013.01); *A63B 2102/32* (2015.10); *A63B 2220/18* (2013.01);

(Continued)

(58) Field of Classification Search
CPC ..... A63B 71/0622; A63B 71/06; A63B 69/36; A63B 2220/805; A63B 2220/20; A63B 2220/18; A63B 2071/0694; A63B 2102/32; H01S 5/026; G01D 21/02; G01C 9/06; G01C 2009/066; G01B 11/14; G01B 11/026; G01B 5/0023
See application file for complete search history.

(56) References Cited

U.S. PATENT DOCUMENTS

| | | | | |
|---|---|---|---|---|
| 6,485,413 | B1 * | 11/2002 | Boppart | ............. A61B 1/00096 |
| | | | | 356/450 |
| 2006/0122001 | A1 * | 6/2006 | Gaddy | ............... A63B 69/3614 |
| | | | | 473/220 |
| 2010/0267460 | A1 * | 10/2010 | Kuhlman, Jr. | ..... A63B 69/3614 |
| | | | | 473/220 |

FOREIGN PATENT DOCUMENTS

KR    100630462  B1 *  10/2006

* cited by examiner

*Primary Examiner* — Jeffrey S Vanderveen
(74) *Attorney, Agent, or Firm* — IPLA P.A.

(57) ABSTRACT

A measurement device (100) for a golf course green comprises: a distance measurement unit (30) having a pair of laser transmitter/receivers (32) for emitting a pair of laser beams (L; L1, L2), for distance measurement, outwardly at a predetermined emission angle with respect to the forward direction (CEN); a control unit (50) for generating hole-cup position information and hole-cup gradient information from an arithmetic operation of data on the distance measured by the pair of laser transmitter/receivers (32) of the distance measurement unit (30) and data on the emission angle; and an output unit (60) provided outside a casing (10) so as to output the hole-cup position information and hole-cup gradient information generated by the control unit (50).

5 Claims, 3 Drawing Sheets

(51) Int. Cl.
*H01S 5/026* (2006.01)
*A63B 102/32* (2015.01)
(52) U.S. Cl.
CPC ..... *A63B 2220/20* (2013.01); *A63B 2220/805* (2013.01); *G01C 2009/066* (2013.01)

NON-CONTACT MEASUREMENT DEVICE FOR GOLF COURSE GREEN

BACKGROUND

The present invention relates generally to a non-contact measurement device for a golf course green. More particularly, the present invention relates to a non-contact measurement device for a golf course green, in which it is possible to easily and accurately measure not only the distance and height from the position of the golf ball to the target point such as a hole cup, but also the left and right gradient of any point around the hole cup or the green When putting on the green in a golf game, it is necessary to establish a putting strategy considering the distance from the given position of the golf ball to the hole cup, the height of the hole cup, and the inclination angle on the path. Regarding this, it is common to visually or sensibly determine the direction and distance of putting to select an iron club or to adjust the swing direction. However, in such a case, errors due to the eye measurement and many trials and errors are caused, thereby causing obstacles to improvement. To solve these problems, digitalized equipment has been developed, but it has not been universalized due to the high price and inaccuracy of the digitalized equipment.

Meanwhile, conventional devices for measuring the slope of a green generally consist of a contact-type inclinometer. These contact-type inclinometers use bubbles, beads, and gravity sensors, but they must be used in contact with the ground, so they can be used to determine slopes of very local greens. Accordingly, it is practically impossible to determine the overall green slope, and information about the height cannot be confirmed. In addition, the contact-type inclinometer is a problematic in that it causes inconvenience to other players.

Therefore, development of a non-contact measurement device for a golf course green that can solve the above problems is required.

SUMMARY OF THE INVENTION

Accordingly, an object of the present invention is to provide a non-contact measurement device for a golf course green with improved convenience, accuracy and usability of measurement of the green in a golf course green.

In order to accomplish the above object, the present invention provides a non-contact measurement device 100 for a golf course green, the measurement device including: an inertia measurement unit 20 provided in a casing 10 to measure a change in inertia of the casing 10; a distance measurement unit 30 provided with a pair of laser transmitter/receivers 32 to measure a distance by being variably rotated; a rotation driving unit 40 configured to rotate the distance measurement unit 30 in a true horizontal direction; a control unit 50 configured to control driving of the rotation driving unit 40 and generate data on hole-cup position information and data on hole-cup gradient information from the distance measured by the distance measurement unit 30 and the change in inertia measured by the inertia measurement unit 20; and an output unit 60 provided outside the casing 10 to output the hole-cup position information and the hole-cup gradient information generated by the control unit 50.

According to the present invention, it is possible to easily and accurately acquire information on a golf course green.

DETAILED DESCRIPTION OF THE INVENTION

Figure 1:
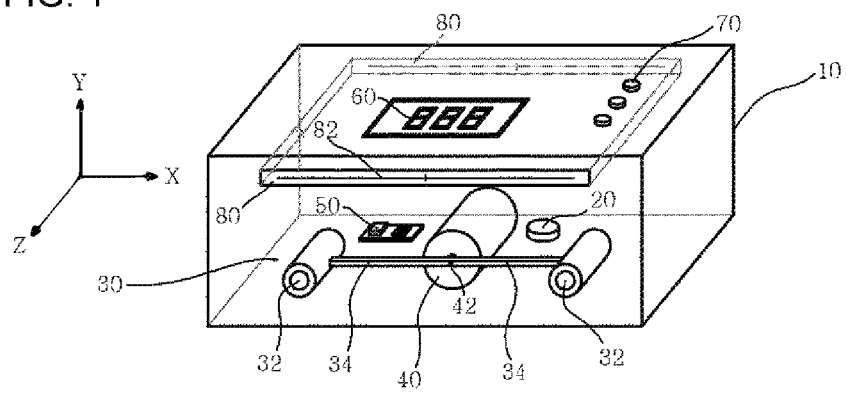
FIG. 1 is a schematic perspective view showing a non-contact measurement device for a golf course green according to a preferred first embodiment of the present invention.

According to another aspect of the present invention, there is provided a measurement device 100 for a golf course green, the measurement device including: a distance measurement unit 30 provided with a pair of laser transmitter/receivers 32 in which a pair of laser beams L1 and L2 (L) for measuring a distance are emitted outwardly from each other at a predetermined emission angle β with respect to a forward direction CEN; a control unit 50 configured to generate hole-cup position information and hole-cup gradient information from calculation of data on the distance measured by the pair of laser transmitter/receivers 32 of the distance measurement unit 30 and data on the emission angle β; and an output unit 60 provided outside a casing 10 to output the hole-cup position information and the hole-cup gradient information generated by the control unit 50.

Figure 2:
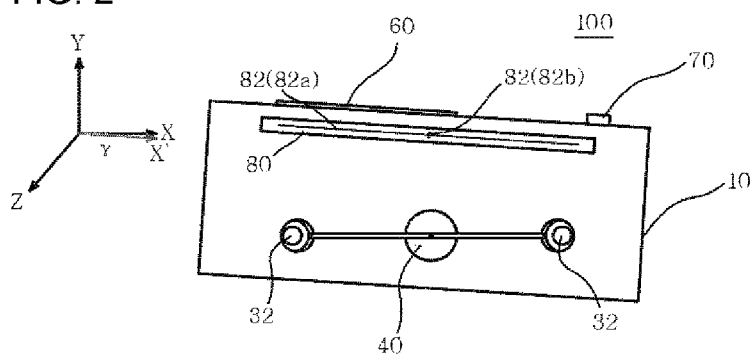
FIG. 2 is a conceptual view showing a relation between a distance measurement unit and a see-through window in the non-contact measurement device for a golf course green according to the preferred first embodiment of the present invention.
Figure 3:
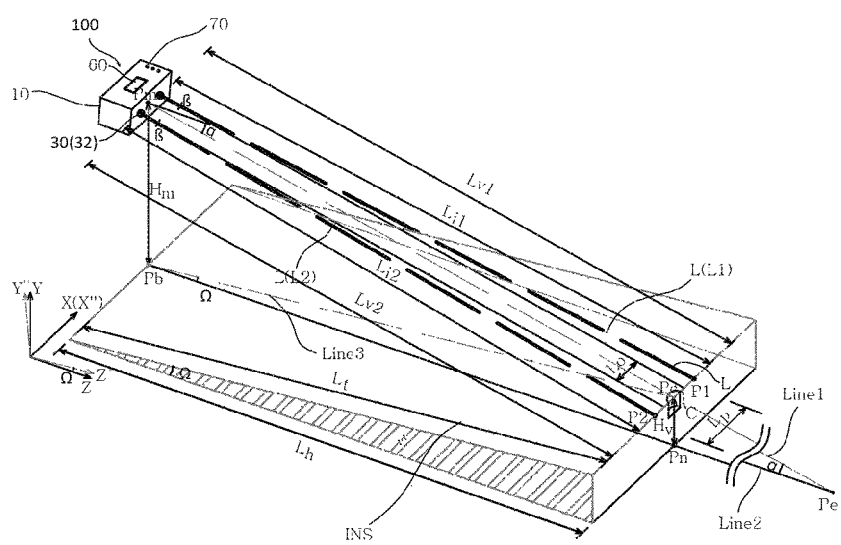
FIG. 3 is a schematic view showing a case where when left and right heights around a hole cup are the same, a laser beam is emitted to a point around the hole cup to measure a distance in the non-contact measurement device for a golf course green according to the preferred first embodiment of the present invention.

As shown in FIGS. 1 to 3, according to the preferred first embodiment of the present invention, a non-contact measurement device 100 for a golf course green includes: an inertia measurement unit 20 provided in a casing 10 to measure a change in inertia of the casing 10; a distance measurement unit 30 provided with a pair of laser transmitter/receivers 32 to measure a distance by being variably rotated; a rotation driving unit 40 configured to rotate the distance measurement unit 30 in a true horizontal direction;

a control unit 50 configured to control driving of the rotation driving unit 40 and generate data on hole-cup position information and data on hole-cup gradient information from the distance measured by the distance measurement unit 30 and the change in inertia measured by the inertia measurement unit 20; and an output unit 60 provided outside the casing 10 to output the hole-cup position information and the hole-cup gradient information generated by the control unit 50. In the drawings, unexplained reference numeral 70 is a switch 70 for switching the operation of the non-contact measurement device 100 for a golf course green according to the preferred first embodiment of the present invention.

Meanwhile, according to the non-contact measurement device 100 for a golf course green according to the preferred first embodiment of the present invention, it is preferable that the casing 10 is further provided with a see-through window 80 on the front and rear surfaces thereof to observe the hole cup C or therearound. The see-through window 80 is provided with reference lines 82 to provide the necessary criteria for the measurement of the left and right slope (or back and forth slope) around the hole cup or the distance of the hole cup C. The reference lines 82 are constituted by a horizontal reference line 82*a* and a vertical reference line 82*b*. It is preferable that a rotation axis 42 of the rotation driving unit 40 is positioned on the same line as the extension line of the vertical reference line 82*b*.

It is preferable that the inertia measurement unit 20 measures the change in inertia of the casing 10, more preferably, the change in the center position of the horizontal reference line 82*a* and the vertical reference line 82*b*, which are the reference lines 82, based on the angular variation of the X axis, which is the true horizontal axis, relative to the origin of the orthogonal coordinate axes (Y and Z axes originating from the intersection between the horizontal and vertical reference lines of the front or back see-through window 80). Meanwhile, according to a modification of the present invention, the change in inertia measured by the inertia measurement unit 20 may be measured based on the angular variation of the X axis, which is the true horizontal axis, having a reference point inside the casing 10 as the origin (for example, a reference point having a center point connecting the centers of the front and rear see-through windows 80, as the origin), relative to the origin of the orthogonal coordinate axes (Y and Z axes) perpendicular thereto. For convenience of explanation, the origin of the X, Y and Z axes is shown in a state in which each axis is moved in parallel.

Figure 5:
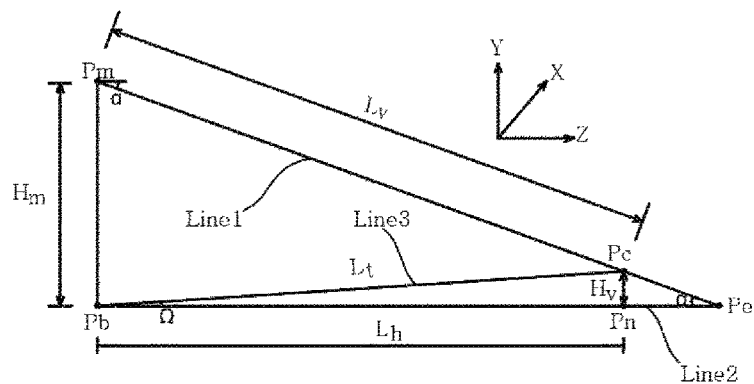
FIG. 5 is a schematic view when viewed from YZ plane when left and right heights around the hole cup are the same in FIG. 3.
Figure 7:
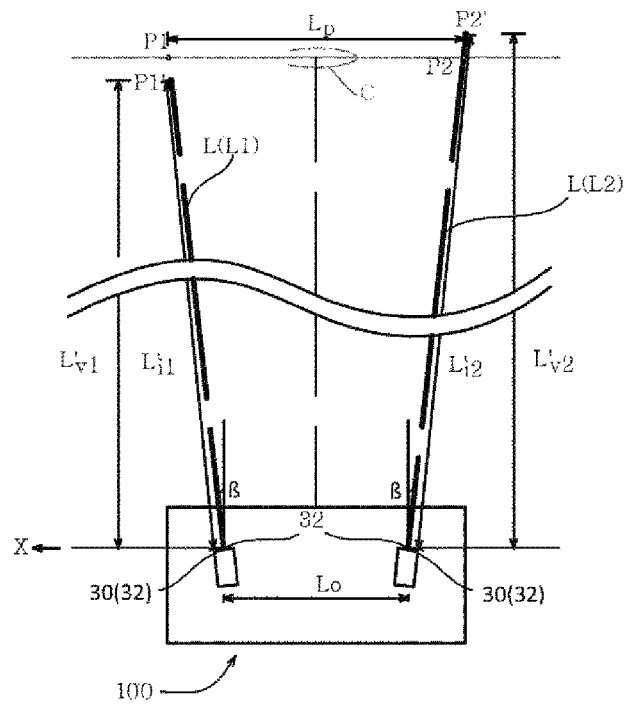
FIG. 7 is a schematic view when viewed from a plane where a pair of laser transmitter/receivers emit to the point around the hole cup when the left side around the hole cup is higher than the right side in FIG. 3.

For example, to measure the slope from the non-contact measurement device 100 for a golf course green to the hole cup C, as shown in FIGS. 3 and 5, when the switch 70 is pressed in a state where the non-contact measurement device 100 for a golf course green is tilted at a projection angle α so that the perimeter of the hole cup C is aimed through the see-through window 80 of the non-contact measurement device 100 for a golf course green grasped by the user standing on the user's ball position Pb at the observation position, the control unit 50 generates a control signal such that the inertia measurement unit 20 measures an angle α between a line Line 1 connecting the position Pm of the non-contact measurement device 100 for a golf course green and the hole cup C position Pc, and a line Line 2, which is an orthogonal projection of the line Line1 with respect to the true horizontal plane (XZ plane in FIG. 7).

Figure 4:
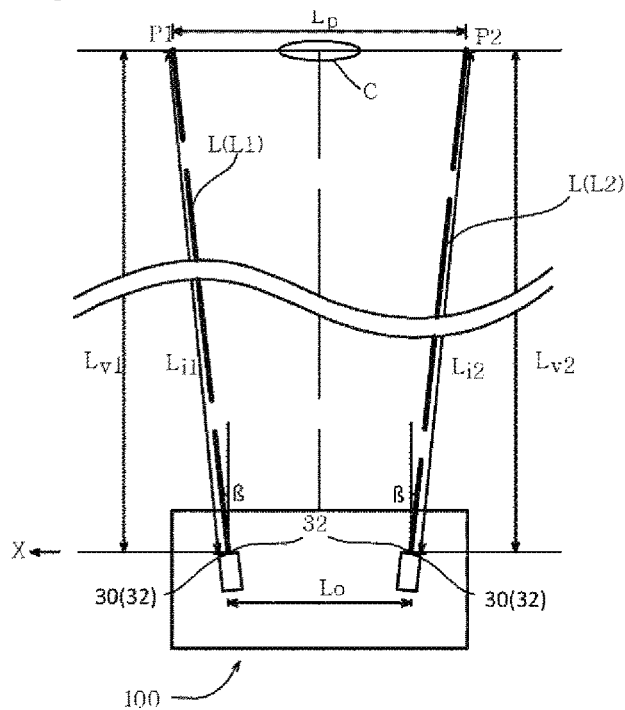
FIG. 4 is a schematic view when viewed from a plane where a pair of laser transmitter/receivers emit to the point around the hole cup when left and right heights around the hole cup are the same in FIG. 3.

The distance measurement unit 30 is constituted by a pair of distance meters rotated symmetrically about the rotation axis 42 provided on a vertical extension line of the intersection between the horizontal reference line 82*a* and the vertical reference line 82*b* of the see-through window 80 or on a vertical extension line of the intersection between the (virtual) horizontal reference line 82*a* and the (virtual) vertical reference line 82*b* inside the casing 10. The distance measurement unit 30 is constituted by laser transmitter/receivers 32 for measuring the distance around the hole cup C. Here, as shown in FIG. 4, the pair of laser transmitter/receivers 32 are arranged at a predetermined angle β outwardly from each other, preferably, symmetrically arranged with respect to the center point of the rotation axis 42 at an angle of 3 to 6 degrees with respect to the vertical plane of the front case where the laser beam is projected to face outwardly from each other.

As described above, since the laser transmitter/receivers 32 of the distance measurement unit 30 are provided to emit a laser outwardly from each other, to measure the perimeter of the hole cup C at a predetermined distance from the hole cup C, laser beams L1 and L2 (L) emitted from the laser transmitter/receivers 32 may have points P1 and P2 (see FIGS. 3 and 4) which are observation points broadly positioned around the hole cup C. Herein, the points P1 and P2, as the observation points, are the points where the laser beams L1 and L2 (L) reach around the hole cup C.

The laser transmitter/receivers 32 of the distance measurement unit 30 are symmetrically provided at opposite ends of a connecting shaft 34 with respect to the rotation axis 42 to be rotated.

The rotation driving unit 40 is constituted by a driver for rotating the pair of laser transmitter/receivers 32 about the rotation axis 42 in the true horizontal direction (see the X axis in FIGS. 1 to 7). The rotation driving unit 40 is constituted by a motor, preferably, a stepping motor for rotating the laser transmitter/receivers 32 of the distance measurement unit 30 in the true horizontal direction.

For example, as shown in FIG. 2, in order for the user to observe around the hole cup, when the non-contact measurement device 100 for a golf course green is tilted at an angle of γ with respect to the true horizontal (see X axis), the angle of γ tilted with respect to the true horizontal is measured by the inertia measurement unit 20, and the control unit 50 drives the rotation driving unit 40 to correspond to the tilted angle of γ, such that the laser transmitter/receivers 32 of the distance measurement unit 30 is disposed on the same axis as the true horizontal (see X axis). Accordingly, in order for the user to measure around the hole cup C through the see-through window 80, the laser transmitter/receivers 32 of the distance measurement unit 30 is disposed on the same true horizontal (see X axis) line even though the non-contact measurement device 100 for a golf course green is tilted with respect to the true horizontal (see X axis).

The control unit 50 controls driving of the rotation driving unit 40 to correspond to the change in inertia measured by the inertia measurement unit 20 such that the laser transmitter/receivers 32 of the distance measurement unit 30 are disposed on the true horizontal line, and generates the data on the hole-cup position information and the data on the hole-cup gradient information from distances respectively measured by the laser transmitter/receivers 32 of the distance measurement unit 30 and the change in inertia measured by the inertia measurement unit 20. Herein, the hole-cup position information refers to data on a distance from the ball position Pb (see FIG. 3) of the user of the non-contact measurement device for a golf course green to the hole cup C position Pc (see FIG. 3), and the hole-cup gradient information refers to data on the left and right gradient around the hole cup C (see FIG. 8) and a height from the user's ball position Pb to the hole cup C position Pc.

The output unit 60 is constituted by a display provided outside the casing 10 to output the hole-cup position information and the hole-cup gradient information generated by the control unit 50.

Reference will be made to operation of the non-contact measurement device for a golf course green according to the preferred first embodiment of the present invention.

Firstly, as shown in FIG. 3 (the origin of the X, Y, and Z coordinate axes in the drawing are shown on the left side of the drawing for convenience of explanation), it is exemplary that a case where the laser beams L1 and L2 (L) for distance measurement are emitted from a position Pm (a midpoint connecting the pair of laser transmitter/receivers 32 as the position where the user grips the non-contact measurement device 100 for a golf course green) vertically positioned by a predetermined height from the user's ball position Pb (a position on the ground vertical from the center point connecting the pair of laser transmitter/receivers 32) as the observation position of an inclined surface INS on which the hole cup C is located on the inclined surface INS inclined at a predetermined inclination angle $\Omega$ with respect to the horizontal plane (XZ plane in the drawing), to the points P1 and P2 around the hole cup C.

FIG. 3 shows a case where the vertical height (height in the Y axis direction Hv1, Hv2) of the points P1 and P2 around the hole cup C is the same as the vertical height $H_v$ of the hole cup C, wherein FIG. 4 is a schematic view when viewed from a plane where the pair of laser transmitter/receivers 32 emit to the points P1 and P2 around the hole cup C, and FIG. 5 is a schematic view when viewed from the YZ plane. For convenience of explanation, description will be made with reference to FIGS. 4 and 5. In FIGS. 3 to 5, the position of the hole cup is denoted by Pc; the line passing through the center position Pc of the hole cup C on the ground from the midpoint Pm connecting the pair of laser transmitter/receivers 32 is denoted by Line 1; the contact point of the line Line 2 starting from the user's ball position Pb, which is the observation position on the true horizontal plane (XZ plane), and intersecting with the line Line 1 is denoted by Pe; the nodal point that extends perpendicularly from the center position Pc of the hole cup C and intersects with the line Line 2 are denoted by Pn; the line connecting the user's ball position Pb as the observation position to the hole-cup position Pc is denoted by Line 3; the angle $\Omega$ is an angle between the line Line 2 on the true horizontal plane (XZ plane) and the line Line 3 on the inclined surface INS; the angle $\alpha$ is an angle between the line Line 2 on the true horizontal plane (XZ plane) and the line Line1 on the laser beam irradiation surface; the height $H_m$ is a distance (vertical height) between the user's ball position Pb as the observation position and the midpoint Pm connecting the pair of laser transmitter/receivers 32; the distance $L_h$ is a distance between the user's ball position Pb as the observation position and the nodal point Pn; the distance $L_t$ is a distance on the line of the inclined surface INS between the user's ball position Pb as the observation position and the hole cup position Pc; the height $H_v$, which is a distance (vertical height) between the nodal point Pn and the hole-cup position Pc, is the average value of the vertical heights (heights $H_{v1}$ and $H_{v2}$ in the Y axis direction) of the points P1 and P2 around the hole cup C; the distance $L_v$, which is the average value of distances $L_{v1}$ and $L_{v2}$ that are obtained by orthogonally projecting each distance from each of the laser transmitter/receivers 32 to each of the points P1 and P2 around the hole C with respect to a normal perpendicular to the connecting line connecting the pair of laser transmitter/receivers 32, is a distance between the midpoint Pm connecting the pair of laser transmitter/receivers 32 and the hole-cup position Pc.

As shown in FIGS. 3 and 4, by the laser transmitter/receivers 32, the laser beams L1 and L2 (L) are emitted to the points P1 and P2 around the hole cup C outwardly from each other at a predetermined angle $\beta$ with respect to the forward direction, wherein the distance $L_i$ (the average value of $L_{i1}$ and $L_{i2}$) of the laser beams L1 and L2 (L) from the laser transmitter/receivers 32 to the points P1 and P2 around the hole cup C is measured. Herein, $L_{i1}$ and $L_{i2}$ are the measured distance from each of the laser transmitter/receivers 32 to the points P1 and P2 around the hole cup C.

Assuming that the distance between the center points of the pair of laser transmitter/receivers 32 is Lo, the distance between the points P1 and P2 around the hole cup C is $L_p=2L_i \sin \beta + L_o$, and the shortest distance from the midpoint Pm of the laser transmitter/receivers 32 to the points P1 and P2 around the hole cup C is $L_v = L_i \cos \beta$.

Meanwhile, as shown in FIGS. 3 to 5, the vertical height (distance between the hole-cup position Pc and the nodal point Pn) of the hole cup C with respect to the true horizontal plane (XZ plane) is $H_v = H_m - L_v \sin \alpha$, and the distance (distance between the user's ball position Pb as the observation position and the nodal point Pn) from the user's ball position Pb as the observation position where the user stands to the true horizontal plane (XZ plane) where the hole cup C is positioned is $L_h = \sqrt{L_v^2 - (H_m - H_v)^2}$. Herein, $H_m$ is the distance from the user's ball position Pb as the observation position to the midpoint Pm connecting the pair of laser transmitter/receivers 32, and is preferably stored in the control unit 50 in advance by the user, and may be stored in the control unit 50 by measuring the distance by vertically emitting the laser transmitter/receivers 32 from the midpoint Pm to the user's ball position Pb as the observation position when needed.

Meanwhile, the distance between the user's ball position Pb as the observation position and the hole-cup position Pc on the inclined surface INS is $L_t = \sqrt{L_v^2 + H_m^2 - 2L_v H_m \sin \alpha}$.

As described above, when there is no left and right slopes at the points P1 and P2 around the hole cup C, the height $H_v$ of the hole cup C vertically positioned with respect to the true horizontal plane (XZ plane) where the user stands, the distance $L_h$ on the true horizontal plane (XZ plane) from the user's ball position Pb as the observation position where the user stands on the true horizontal plane (XZ plane) to the hole cup C, and the distance $L_t$ on the inclined surface between the user's ball position Pb and the hole-cup position Pc are displayed on the output unit 60 through the above calculation by the control unit 50.

Figure 6:
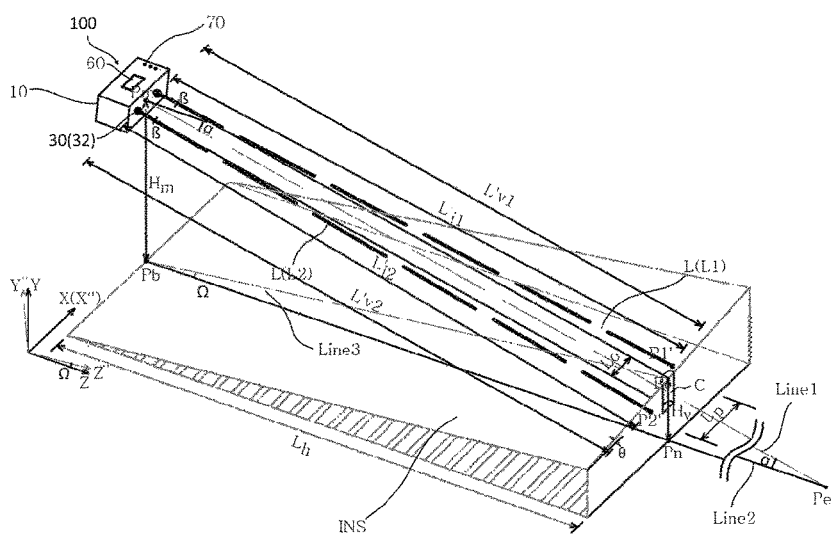
FIG. 6 is a schematic view showing a case where when there are left and right slopes around the hole cup, a laser beam is emitted to the point around the hole cup to measure a distance in the non-contact measurement device for a golf course green according to the preferred first embodiment of the present invention.

Meanwhile, as shown in FIG. 6, the case where there are left and right slopes around the hole cup C, for example, the case where the left side around the hole cup is higher than the right side will be described. In FIGS. 6 to 7 in which there are slopes around the hole cup, the differences from FIGS. 3 to 5, in which there is no slopes, will be mainly described, and the same reference numerals are used for the same functions within the scope not to be confused with each other, and as there are left and right slopes around the hole cup, points around the hole cup C emitted by the laser transmitter/receivers 32 are denoted by P1' and P2' to distinguish the same from the points P1 and P2 in FIGS. 3 to 5. In FIG. 7, the points P1 and P2 are virtual points where the laser beams L1 and L2 (L) are emitted around the hole cup, assuming that there is no left and right slopes (slope of the X axis). In FIGS. 6 and 7, since the left side of the hole cup has a higher slope than the right side when the user views the hole cup direction, the distance $L'_{i1}$ to the point P1' where the laser beam L1 reaches the inclined surface on the left side of the hole cup C is shorter than the distance $L'_{i2}$ to the point P2' where the laser beam L2 reaches the inclined surface on the right side of the hole cup C.

Likewise, the distances from the laser transmitter/receivers 32 to the points P1' and P2' by the laser beams L1 and L2 (L) are denoted by $L'_{i1}$ and $L'_{i2}$ respectively, which are distinguished from $L_{i1}$ and $L_{i2}$ in FIGS. 3 to 5. Further, the distances $L'_{i1}$ and $L'_{i2}$ are distances that are obtained by orthogonally projecting each distance from each of the laser transmitter/receivers 32 to each of the points P1' and P2' around the hole C with respect to a normal perpendicular to the connecting line connecting the pair of laser transmitter/receivers 32, and the distance $L'_v$ is the average value of $L'_{v1}$ and $L'_{v2}$.

Figure 8:
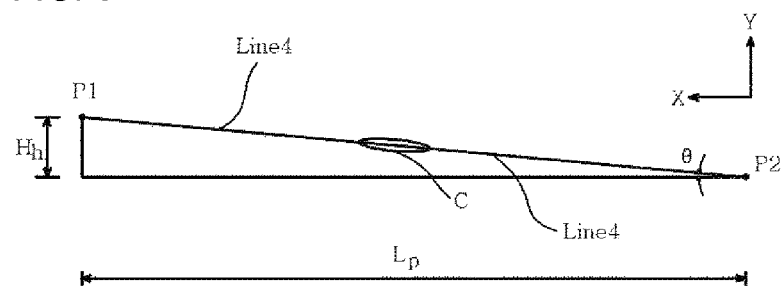
FIG. 8 is a conceptual view showing a cross section of the left and right sides around the hole cup when there are left and right slopes around the hole cup.

Meanwhile, in FIG. 8, reference numeral Line4 denotes the line connecting the points P1 and P2 around the hole cup C; $L_p$ denotes the distance between the points P1 and P2 around the hole cup C; and angle θ denotes the angle between the line Line4 connecting the points P1 and P2 around the hole cup C and the true horizontal plane (XZ plane).

Likewise, the height difference on the true horizontal plane (XZ plane) between the points P1 and P2 around the hole cup C is $H_h=H_{v1}-H_{v2}$. Herein, vertical heights $H_{v1}$ and $H_{v2}$ of the points P1 and P2 with respect to the true horizontal plane are distinguished by subscripts by applying the above described equation $H_v=H_m-L_v \sin \alpha$ to each of the laser transmitter/receivers 32. Meanwhile, as the orthogonal projection distance on true horizontal plane for the points P1 and P2 around the hole cup C is $L_p=(L_{i1}+L_{i2})\sin \beta + L_o$, the left and right inclination angle around the hole cup is $\theta=\tan^{-1}(H_h/L_P)$.

Also in the case where the hole cup is positioned on the left and right inclined surface, as described, based on the information around the hole cup measured when the laser transmitter/receivers are positioned horizontally with respect to the true horizontal plane, the control unit 50 controls the output unit 60 to display the distance from the observation position to the hole cup, the height of the hole cup with respect to the true horizontal plane (XZ plane), and the left and right inclination angle θ of the hole cup.

Therefore, according to the present invention, more precise putting can be achieved by allowing the user to easily obtain information for putting around the hole cup when putting on the green.

Meanwhile, according to the preferred second embodiment of the present invention, it is different in that the pair of laser transmitter/receivers are fixed relative to the casing, but have the same configuration as the above-described embodiment.

Figure 9:
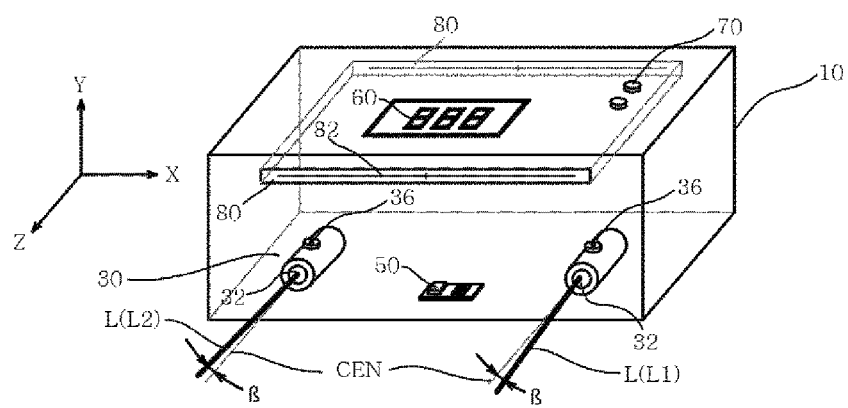
FIG. 9 is a schematic perspective view showing a measurement device for a golf course green according to a preferred second embodiment of the present invention.

In other words, the measurement device 100 for a golf course green according to the preferred second embodiment of the present invention, as shown in FIG. 9, includes: the distance measurement unit 30 provided with the pair of laser transmitter/receivers 32 in which a pair of laser beams L1 and L2 (L) for measuring a distance are emitted outwardly from each other at a predetermined emission angle β with respect to the forward direction CEN; the control unit 50 configured to generate hole-cup position information and hole-cup gradient information from calculation of data on the distance measured by the pair of laser transmitter/receivers 32 of the distance measurement unit 30 and data on the emission angle β; and the output unit 60 provided outside the casing 10 to output the hole-cup position information and the hole-cup gradient information generated by the control unit 50. The description of the same configuration as the first embodiment will be omitted in the second embodiment.

It is preferable that the casing 10 is further provided with a see-through window 80 on the front and rear surfaces thereof to observe the hole cup C or therearound. The see-through window 80 is provided with reference lines 82 to provide the necessary criteria for the measurement of the left and right slope (or back and forth slope) around the hole cup or the distance of the hole cup C. The reference lines 82 are constituted by a horizontal reference line 82a and a vertical reference line 82b.

The distance measurement unit 30 is constituted by a pair of distance meters rotated symmetrically about the rotation axis 42 provided on a vertical extension line of the intersection between the horizontal reference line 82a and the vertical reference line 82b of the see-through window 80 or on a vertical extension line of the intersection between the (virtual) horizontal reference line 82a and the (virtual) vertical reference line 82b inside the casing 10. The distance measurement unit 30 is constituted by laser transmitter/receivers 32 for measuring the distance around the hole cup C. Here, as shown in FIG. 4, the pair of laser transmitter/receivers 32 are arranged at a predetermined angle β outwardly from each other, preferably, symmetrically arranged with respect to the center point of the rotation axis 42 at an angle of 3 to 6 degrees with respect to the vertical plane of the front case where the laser beam is projected to face outwardly from each other.

Meanwhile, the distance measurement unit 30 further includes a beam path adjustment unit 36 such that the laser transmitter/receivers 32 are variably rotated outwardly from each other at the predetermined angle β.

It is preferable that the beam path adjustment unit 36 of the distance measurement unit 30 is constituted by a rotation driving member to variably rotate the pair of laser transmitter/receivers 32 outwardly from each other at the predetermined angle β.

Here, as the laser transmitter/receiver is fixed with respect to the casing, the path of the laser beam is transformed by the coordinate transformation, and the above result can be obtained.

Meanwhile, according to another modification of the present invention, by emitting the beams from the pair of laser transmitter/receivers 32 according to the inclination angle around the hole cup, the distance value from each of the laser transmitter/receivers 32 is measured. Here, the control unit performs the calculation under the assumption that the perimeter of the hole cup forms a virtual constant plane as the information for putting around the hole cup.

The invention claimed is:

1. A non-contact measurement device (100) for a golf course green, the measurement device comprising:
   an inertia measurement unit (20) provided in a casing (10) to measure a change in inertia of the casing (10);
   a distance measurement unit (30) provided with a pair of laser transmitter/receivers (32) to measure a distance by being variably rotated;
   a rotation driving unit (40) configured to rotate the distance measurement unit (30) in a true horizontal direction;
   a control unit (50) configured to control driving of the rotation driving unit (40) and generate data on hole-cup position information and data on hole-cup gradient information from the distance measured by the distance measurement unit (30) and the change in inertia measured by the inertia measurement unit (20); and an output unit (60) provided outside the casing (10) to output the hole-cup position information and the hole-cup gradient information generated by the control unit (50).

2. The measurement device (100) of claim 1, wherein the pair of laser transmitter/receivers (32) are symmetrically arranged with respect to a center point of a rotation axis (42) at a predetermined angle ($\beta$) outwardly from each other.

3. The measurement device (100) of claim 2, wherein the control unit (50) controls driving of the rotation driving unit (40) to correspond to the change in inertia measured by the inertia measurement unit (20) such that the pair of laser transmitter/receivers (32) are disposed on a true horizontal line, and generates the data on the hole-cup position information and the data on the hole-cup gradient information from distances respectively measured by the pair of laser transmitter/receivers (32) and the change in inertia measured by the inertia measurement unit (20).

4. The measurement device (100) of claim 3, wherein the data on the hole-cup position information is data on a distance from a user's ball position (Pb) to a hole cup (C) position (Pc), and the data on the hole-cup gradient information is data on a left and right gradient around the hole cup (C) and a height from the ball position (Pb) to the hole cup (C) position (Pc).

5. A measurement device (100) for a golf course green, the measurement device comprising:

a distance measurement unit (30) provided with a pair of laser transmitter/receivers (32) in which a pair of laser beams (L; L1, L2) for measuring a distance are emitted outwardly from each other at a predetermined emission angle ($\beta$) with respect to a forward direction (CEN);

a control unit (50) configured to generate hole-cup position information and hole-cup gradient information from calculation of data on the distance measured by the pair of laser transmitter/receivers (32) of the distance measurement unit (30) and data on the emission angle ($\beta$); and an output unit (60) provided outside a casing (10) to output the hole-cup position information and the hole-cup gradient information generated by the control unit (50).

\* \* \* \* \*